United States Patent [19]

Weldon

[11] Patent Number: 4,495,462
[45] Date of Patent: Jan. 22, 1985

[54] CURRENT SOURCE TEST CIRCUITRY

[75] Inventor: Thomas G. Weldon, Milpitas, Calif.

[73] Assignee: Raytheon Company, Lexington, Mass.

[21] Appl. No.: 471,945

[22] Filed: Mar. 3, 1983

[51] Int. Cl.³ .......................................... G01R 19/18
[52] U.S. Cl. .............................. 324/120; 324/57 R; 324/73 R; 324/158 R; 330/252; 330/260
[58] Field of Search ................ 324/73 R, 120, 158 R, 324/57 R; 330/252, 260, 174

[56] References Cited

U.S. PATENT DOCUMENTS 3,588,530  6/1971  Langan .............................. 330/252

OTHER PUBLICATIONS

Barna, Arpad, *Operational Amplifiers*, New York: Wiley-Interscience, 1971, pp. 22–26.
Pease, Robert A., "Improvement Circuit Performance with a 1-op-amp Current Pump", in *EDN*, Jan. 20, 1983, pp. 85–90.
Clayton, G. B., "Operational Amplifiers", in *Wireless World*, Apr. 1969, pp. 154–156.

*Primary Examiner*—Stewart J. Levy
*Attorney, Agent, or Firm*—Richard M. Sharkansky; Joseph D. Pannone; Denis G. Maloney

[57] ABSTRACT

A test circuit for determining the current produced by a current source device with a predetermined, non-zero voltage at the output of the device. The circuit includes a current to voltage converter circuit for converting the current produced by the current source device, typically a digital-to-analog converter (DAC), into a corresponding voltage. A control voltage source is coupled to the output of the current source device and to the current to voltage converter circuit through a coupling circuit. The coupling circuit couples a predetermined portion of the control voltage to the output of the current source device and to the current to voltage converter circuit with the voltage produced by the current to voltage converter being proportional to the current produced by the current source device and independent of the control voltage.

With such an arrangement, the compliance voltage range of a DAC may be accurately measured. Further, the test circuit enables the non-linearity and relative accuracy of a DAC to be determined with the output of the DAC having a non-zero voltage at its output.

11 Claims, 1 Drawing Figure

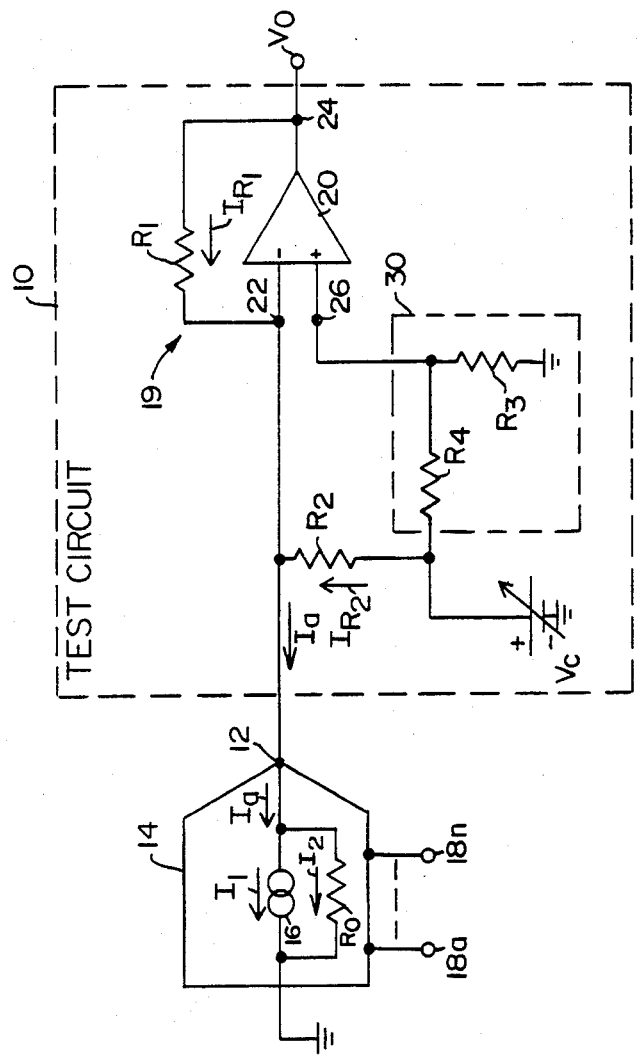

CURRENT SOURCE TEST CIRCUITRY

BACKGROUND OF THE INVENTION

This invention relates generally to test circuitry and more particularly to test circuitry adapted to measure the compliance voltage range of current output devices such as current output digital-to-analog converters (DAC's).

As is known in the art, it is frequently desired to determine the maximum range of output terminal voltage for which a current output device, such as a current output DAC, will provide a specified current output characteristic. This voltage range is typically referred to as the compliance voltage range of the device. The compliance voltage range may alternatively be viewed as the voltage range at the output of a current source device over which the current source will maintain a given accuracy. One such current source device is a current output DAC which produces a current output having a magnitude typically proportional to an n-bit digital word fed to the device. The DAC thus may be considered as a digitally controlled current source, the level of the current produced by such source being proportional to a digital word fed to the device.

As is also known in the art, while the output of the DAC is a current, this output is typically converted into a proportional voltage. Such conversion may, for example, result by connecting a transistor to the output of the DAC, in which case an output voltage is produced across the resistor which is proportional to the current produced by the DAC, or in another example, the output of the DAC is fed to an operational amplifier having a feedback resistor which produces an output voltage proportional to the current produced at the output of the DAC. In either example, however, because of the internal impedance of the DAC, the DAC cannot be considered as an "ideal" current source and hence the output current will change to some degree from that defined by the digital word fed to it because of the current through the internal impedance resulting from the voltage produced at the output terminal of the DAC. This change or variation in the desired output current as a function of output voltage is the compliance voltage range of the DAC and such must be measured to advise the user of the DAC so that such user is able to determine whether the DAC with such specified compliance is suitable for the user's particular application.

One technique used to measure compliance voltage range is to connect a voltage source with a current measuring capability to the output of the DAC. The DAC is typically set to full scale (i.e. maximum) current output and the voltage of the voltage source is varied while the change in output current is measured. While such technique has been used successfully in some applications, the technique is generally inadequate using automatic test equipment with 10 bit DAC devices requiring a relatively higher degree of measuring accuracy, since accuracy to one-half the least significant bit must be measured, typically 2 microamps, in the presence of typically 0.2 microamps of noise. Still further accuracy is required where so-called "functional compliance" (i.e. differential non-linearity or relative accuracy) must be measured with finite, non-zero voltages produced at the output of the DAC.

SUMMARY OF THE INVENTION

In accordance with the present invention, apparatus is provided for determining the current produced by a current source device with a predetermined voltage at the output of the device, such apparatus comprising: means, coupled to the output of the current source device, for converting the current produced by such current source device into a corresponding voltage; a control voltage source; and means, coupled to the output of the current source device and the voltage converting means, for coupling a portion of the control voltage produced by the control voltage source to the output of the current source device with the voltage produced by the voltage converting means being substantially independent of the control voltage source.

In a preferred embodiment, the voltage converting means includes an operational amplifier having a feedback resistor and a pair of input terminals, one of such input terminals being coupled to: the output of the device; the control voltage source through a coupling resistor; and to the feedback resistor. The other one of the pair of input terminals is coupled to the control voltage source through a voltage divider network. The resistance of the feedback resistor and the resistance of the coupling resistor are selected so that the same portion of the control voltage is coupled to the pair of input terminals of the operational amplifier with the voltage produced at the output of the operational amplifier being proportional to the current produced by the current source and independent of the voltage of the control voltage source.

With such an arrangement, since a portion of the voltage of the control voltage source is coupled to the output of the current source device, the output voltage of such device can be varied in a controlled manner; however, since the output voltage of the operational amplifier is independent of such control voltage but is proportional to the current produced by the device, and hence which provides a measure of the current produced by the device, the compliance voltage range of the device may be measured accurately.

Further, with such arrangement, differential non-linearity or relative accuracy of the current source device such as a DAC may be accurately measured with a predetermined, non-zero voltage coupled to the output of the DAC. More particularly, with the circuit a predetermined portion of the control voltage is coupled to the output of the device, and with such voltage so coupled, the current produced by the device in response to a digital word fed to the DAC may be measured by the converted voltage which itself is independent of the control voltage and is dependent only on the digital word. Thus, with a predetermined, non-zero portion of the control voltage coupled to the output of the DAC, the voltage produced by the voltage converting means is used to measure the DAC current as the bits of the digital word are incremented. This thus allows for measuring the non-linearity or relative accuracy of the DAC with a finite, non-zero voltage at the DAC output.

BRIEF DESCRIPTION OF THE DRAWINGS

The foregoing features of this invention, as well as the invention itself, may be more fully understood from the folllowing detailed description read together with the accompanying drawing, in which the single FIG- URE is a schematic diagram of a test circuit according to the invention.

DESCRIPTION OF THE PREFERRED EMBODIMENT

Referring now to the single FIGURE, a test circuit 10 is shown coupled to the output terminal 12 of a current output digital-to-analog converter (DAC) 14, as shown. The DAC 14 is of any conventional DAC and is here represented by the simplified schematic as including an "ideal" current source 16, which produces a current $I_1$ which passes from the output terminal 12 to ground, as indicated, having a magnitude proportional to an n-bit digital word fed to terminals $18a$–$18n$ of such DAC. The schematic of DAC 14 is also shown to include an internal resistance $R_o$ so that the output current $I_a$ of the DAC is therefore related to some degree not only on the n-bits of the digital word fed to terminals $18a$–$18n$, but also on the amount of current $I_2$ passing through resistor $R_o$ as a result of the voltage at the output terminal 12 of such DAC (i.e. $I_a = I_1 + I_2$). Test circuit 10 is used to measure the change in the output current $I_a$ as a function of the voltage at the output terminal 12 when current source 16 produces a current selected by the digital word fed to terminals $18a$–$18n$ (i.e. the voltage range compliance of the DAC). Here typically such voltage range compliance test is made with $I_1$ maximum (i.e. the bits at terminals $18a$–$18n$ being all logical 1 or logical 0 for a complementary type DAC).

Test circuit 10 includes apparatus 19 for converting the output current $I_a$ produced by the DAC 14 into a proportional voltage $V_o$ at output terminal 24. Here such voltage converting apparatus 19 includes an operational amplifier 20, here of any conventional design having the negative input terminal 22 thereof coupled to: (1) the output terminal 24 thereof through a feedback resistor $R_1$, as shown; (2) the output terminal 12 of the DAC, as shown; and (3) the positive terminal of a variable DC control voltage source $V_c$ through coupling resistor $R_2$, as shown, the negative terminal of such voltage source $V_c$ being connected to ground, as shown. The positive input terminal 26 of the operational amplifier 20 is coupled to the variable control voltage source $V_c$ through a voltage divider network 30, as shown. Here the voltage divider network 30 is a resistor voltage divider network which includes a pair of resistors $R_3$, $R_4$; resistor $R_3$ being connected between the positive input terminal 26 and ground potential (and hence the negative terminal of the voltage source $V_c$, as indicated) and resistor $R_4$ is connected to the positive input terminal 26 and the positive terminal of the voltage source $V_c$, as indicated. The resistors $R_1$, $R_2$, $R_3$, $R_4$ are selected for reasons to become apparent so that $(R_1/R_2) = (R_3/R_4)$. Thus, the voltage divider network 30 couples a portion of the voltage of the control voltage source $V_c$ to the positive input terminal 26 of the operational amplifier, such voltage at such positive input terminal 26 being $V+ = KV_c$ where $K = (R_3/(R_3 + R_4))$, and the coupling resistor $R_2$ couples a portion of the control voltage to the negative input terminal 22 of the operational amplifier through the coupling resistor $R_2$. The output voltage $V_o$ of the operational amplifier 20 changes so that the voltage at the negative input terminal 22 $V-$ is equal to the voltage at the positive input terminal 26 $V+$, i.e. $V+ = V- = KV_c$. Thus, the current through resistor $R_1$ from terminal 24 to terminal 22 is $I_{R1} = (V_o - (KV_c))/R_1$ and the current through resistor $R_2$, $I_{R2}$, from $V_c$ to input terminal 22 is $(V_c - KV_c)/R_2$. It follows then that $I_a = I_{R1} + I_{R2} = [-(V_o/R_1)] - [V_c(K(R_1 + R_2) - R_1)]/[R_1 R_2]$. Therefore, in order for the output of the operational amplifier 20, i.e. the voltage $V_o$, to be independent of the control voltage $V_c$, the control voltage $V_c$, from the equation for $I_a$ above, $K(R_1 + R_2)$, must equal $R_1$. However, since $K = R_3/(R_3 + R_4)$ it follows then that if $(R_1/R_2) = (R_3/R_4)$, $I_a$ will equal $V_o/R_1$, and hence the output voltage $V_o$ at terminal 24, will be independent of the control voltage $V_c$. Thus, with a current $I_a$ selected by the digital word fed to terminals $18a$–$18n$, the voltage at the output terminal 12 of the DAC (i.e. $KV_c$) may be varied by varying the voltage $V_c$ of the variable control voltage $V_c$ and the change in output current $I_a$ may be measured by measuring the output voltage $V_o$ which is now independent of the control voltage $V_c$. Such measurement of the change in $I_a$, as measured by $V_o = R_1 I_a$, for a change in a preselected voltage at the output terminal 12 of the DAC 14 (i.e. a change in $KV_c$) and with a fixed, preselected digital word fed to terminals $18a$–$18n$, typically all logical 1 signals, the compliance voltage range of the DAC may be accurately measured. Alternatively, if the functional compliance of the DAC is desired, i.e. non-linearity or relative accuracy, a fixed, preselected non-zero portion of the control voltage $V_c$ is coupled to the output 12 of DAC 14 and the current $I_a$ is measured via output voltage $V_o$ as the bits of the digital word fed to terminals $18a$ to $18n$ are sequentially incremented. In a preferred embodiment $R_1 = R_2 = R_3 = R_4$, thus the voltage at the output terminal 12 of DAC 14 is $(V_c/2)$.

It is noted that because in a practical circuit the ratio $R_1/R_2$ will not be exactly equal to the ratio $R_3/R_4$, a calibration procedure may be used to remove any error in the output voltage resulting therefrom or from the common mode rejection ratio (CMRR) of the test circuit 10. When measuring the compliance voltage range, for example, a first control voltage $V_{c1}$ is produced by the control voltage source with the DAC electrically decoupled from the test circuit 10 and the output voltage at termnal 24, i.e. $V_{o1}$ is measured, a second control voltage $V_{c2}$ is now selected for production by the control voltage source, and the output voltage $V_{o2}$ at terminal 24 is measured. As noted above, $V_{o1}$ should equal $V_{o2}$; however, because of error sources noted above any difference in $V_{o1}$ and $V_{o2}$ (i.e. $\Delta V_o$) is merely subtracted from the output voltage change produced by the DAC when such DAC is undergoing an actual compliance voltage range test. Thus, by selecting $V_{c1}$ and $V_{c2}$ to be extremes in the voltages to be produced at the output of the DAC during the compliance voltage range test, the $\Delta V_o$ measured during calibration is subtracted (algebraically) from the actual $V_o$ change measured.

Having described a preferred embodiment of the invention, it is now evident that the embodiments incorporating these concepts may be used. For example, while the current source device here tested is a DAC, the circuit may be used to test other current source devices. It is felt, therefore, that this invention should not be limited to the disclosed embodiment, but rather should be limited only by the spirit and scope of the appended claims.

What is claimed is:

1. An electronic circuit, comprising:
    (a) means, coupled to an output of a current source device, for converting a current produced by such current source device into a corresponding voltage;

(b) a control voltage source; and, (c) means, coupled to the output of the current source device and to the current-to-voltage converting means, for coupling a portion of the control voltage produced by the control voltage source to the output of the current source device with the voltage produced by the current-to-voltage converting means being substantially independent of the voltage produced by the control voltage source.

2. An electronic circuit, comprising:

(a) an operational amplifier having a feedback resistor coupled between an output terminal of the operational amplifier and a first input terminal of the operational amplifier, such first input terminal being coupled to a first terminal of the electronic circuit;

(b) a voltage divider network having an output coupled to a second input terminal of the operational amplifier and having an input fed by a voltage source and coupled to a second terminal of the electronic circuit; and (c) a coupling means coupled between the first and second terminals of the electronic circuit.

3. The electronic circuit recited in claim 2 wherein the coupling means is a second resistor.

4. The electronic circuit recited in claim 3 wherein the voltage divider network includes a third and fourth resistor, the fourth resistor being coupled between the second terminal of the electronic circuit and the second input terminal of the operational amplifier, and the third resistor being coupled between a reference potential and the second input terminal of the operational amplifier.

5. The circuit recited in claim 4 wherein the voltage source is coupled between the reference potential and the second terminal of the electronic circuit.

6. The circuit recited in claim 5 wherein the ratio of the resistance of the feedback resistor to the resistance of the second resistor is substantially equal to the ratio of the resistance of the third resistor to the resistance of the fourth resistor.

7. The circuit recited in claim 6 including additionally a current source coupled to the first input terminal of the operational amplifier.

8. Apparatus for determining the current produced by a current source device with a predetermined voltage at the output of the device, such apparatus comprising:

(a) means, coupled to the output of the current source device, for converting current produced by such current source device into a corresponding output voltage;

(b) a control voltage source; and, (c) means, coupled to the output of the current source device and to the current-to-output voltage converting means, for coupling a portion of the control voltage produced by the control voltage source to the output of the current source device with the voltage produced by the current-to-output voltage converting means being related to the current produced by the current source device and substantially independent of the voltage produced by the control voltage source.

9. The apparatus recited in claim 8 wherein the current-to-output voltage converting means includes an operational amplifier having a feedback resistor and a pair of input terminals, one of such input terminals being coupled to: the output of the current source device; the control voltage source through a coupling resistor; and, the feedback resistor, and the other one of the pair of input terminals being coupled to the control voltage source through a voltage divider network.

10. The apparatus recited in claim 9 wherein the resistance of the feedback resistor and the resistance of the coupling resistor are selected so that the same portion of the control voltage is coupled to the pair of input terminals of the operational amplifier.

11. A test circuit for measuring a change in a current produced by a current source device as a function of a change in a voltage present at an output of the current source device, comprising:

means, coupled to the output of the current source device, for converting the current produced by the current source device to a proportional output voltage; and means for coupling a variable control voltage to the output of the current source device and to the current-to-output voltage converting means with the output voltage produced by the current-to-output voltage converting means being substantially independent of the variable control voltage.

* * * * *